(12) United States Patent
Guo et al.

(10) Patent No.: US 10,018,662 B2
(45) Date of Patent: *Jul. 10, 2018

(54) NETWORKED ELECTROSTATIC DISCHARGE MEASUREMENT

(71) Applicant: International Business Machines Corporation, Armonk, NY (US)

(72) Inventors: Wei Guo, Shenzhen (CN); LiCen Mu, Shenzhen (CN); Qiuyi Yu, Shenzhen (CN); WeiFeng Zhang, Shenzhen (CN); Lin Zhao, Shenzhen (CN)

(73) Assignee: International Business Machines Corporation, Armonk, NY (US)

(*) Notice: Subject to any disclaimer, the term of this patent is extended or adjusted under 35 U.S.C. 154(b) by 167 days.

This patent is subject to a terminal disclaimer.

(21) Appl. No.: 15/077,955

(22) Filed: Mar. 23, 2016

(65) Prior Publication Data
US 2017/0276713 A1    Sep. 28, 2017

(51) Int. Cl.
*G08B 21/00* (2006.01)
*G01R 31/00* (2006.01)
*H01L 27/02* (2006.01)

(52) U.S. Cl.
CPC ........ *G01R 31/001* (2013.01); *H01L 27/0248* (2013.01)

(58) Field of Classification Search
CPC ..... G01R 31/001; G01R 19/165; B23P 19/04; H05K 3/30
USPC ...................................................... 340/650
See application file for complete search history.

(56) References Cited

U.S. PATENT DOCUMENTS

| | | | |
|---|---|---|---|
| 4,710,751 A | 12/1987 | Webster | |
| 5,083,117 A * | 1/1992 | Hoigaard | G01R 31/026 324/510 |
| 5,872,455 A | 2/1999 | Pohribnij et al. | |
| 5,903,220 A * | 5/1999 | Jon | G01R 31/002 324/457 |
| 6,150,945 A | 11/2000 | Wilson | |
| 8,138,936 B2 | 3/2012 | Lin | |

(Continued)

FOREIGN PATENT DOCUMENTS

CN    102105016 A    6/2011

OTHER PUBLICATIONS

Guo et al., "Networked Electrostatic Discharge Measurement", U.S. Appl. No. 15/674,752, filed Aug. 11, 2017.
(Continued)

*Primary Examiner* — Kerri McNally
(74) *Attorney, Agent, or Firm* — Nolan M. Lawrence

(57) ABSTRACT

A first electrostatic discharge measurement is received from a first sensor. The first sensor utilizes a wireless network to send the first measurement from a first stage of the assembly line of electronic components susceptible to electrostatic discharge damage. A second electrostatic discharge measurement is received from a second sensor. The second sensor utilizes the wireless network to send the second measurement from a second stage of the assembly line. An electrostatic discharge history is updated for the first assembly stage based on the first electrostatic discharge measurement. The electrostatic discharge history is updated for the second assembly stage based on the second electrostatic discharge measurement. A potential electrostatic danger condition is determined based on the electrostatic discharge history.

20 Claims, 3 Drawing Sheets

(56) References Cited

U.S. PATENT DOCUMENTS

| | | |
|---|---|---|
| 8,866,629 B2 | 10/2014 | Anderson et al. |
| 9,105,573 B2 | 8/2015 | Ayotte et al. |
| 9,711,422 B2* | 7/2017 | Ayotte .................... H01L 22/24 |
| 2008/0192404 A1 | 8/2008 | Nakajima |
| 2013/0132007 A1 | 5/2013 | Dunnihoo |
| 2014/0184237 A1* | 7/2014 | Kunz, Jr. ............. G01R 31/001 |
| | | 324/537 |
| 2015/0154993 A1 | 6/2015 | Gentrup et al. |

OTHER PUBLICATIONS

Accelerated Examination Support Document, U.S. Appl. No. 15/674,752, dated Aug. 7, 2017, 9 pgs.

IBM, "List of IBM Patents or Patent Applications Treated as Related", Aug. 8, 2017, 2 pages.

Unknown, "The Prevention and Control of Electrostatic Discharge (ESD) (AN-40-005)", Application Note, Rev.: A, M150261, Apr. 14, 2015, 8 pages, © 2015 Mini-Circuits.

* cited by examiner

NETWORKED ELECTROSTATIC DISCHARGE MEASUREMENT

BACKGROUND

The present disclosure relates to electrostatic discharge, and more specifically, to connecting electrostatic discharge measurements to provide enhanced protection of electronic components.

Electronic components may provide logic embedded into devices such as personal computers. Electronic components may be utilized in the transportation sector to calculate the movement of automobiles for safety. Electronic components may be utilized in the healthcare industry to automate and increase the accuracy of reading human vital signs. Electronic components may be utilized in the consumer space to provide more varied forms of entertainment.

SUMMARY

Disclosed herein are embodiments of a method, computer program product, and system for preventing damage to electronic components susceptible to damage from an electrostatic discharge in an assembly line. A first electrostatic discharge measurement is received from a first sensor. The first sensor utilizes a wireless network to send the first measurement from a first stage of the assembly line. A second electrostatic discharge measurement is received from a second sensor. The second sensor utilizes the wireless network to send the second measurement from a second stage of the assembly line. An electrostatic discharge history is updated for the first assembly stage based on the first electrostatic discharge measurement. The electrostatic discharge history is updated for the second assembly stage based on the second electrostatic discharge measurement. A potential electrostatic danger condition is determined based on the electrostatic discharge history.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
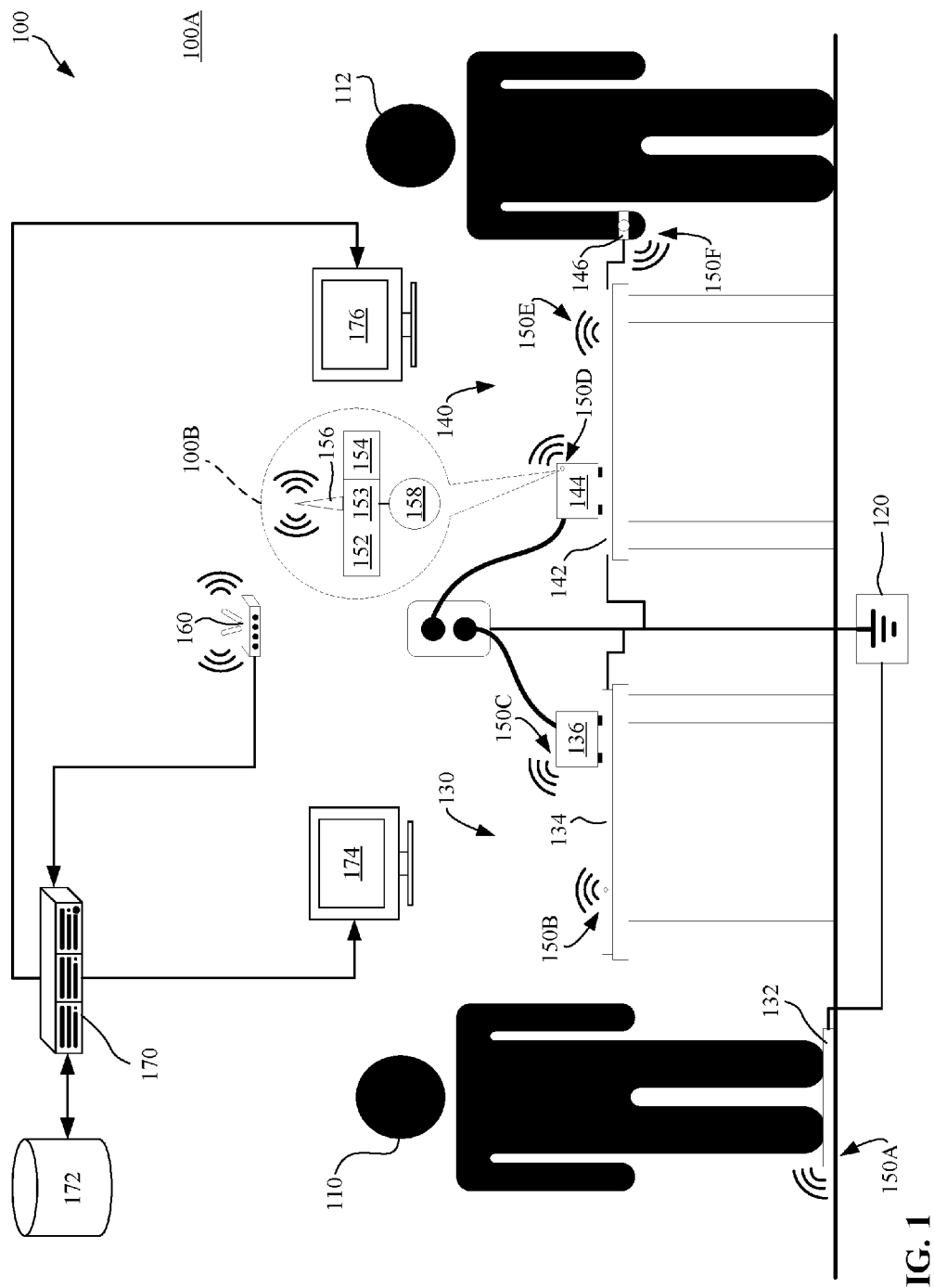
FIG. 1 depicts an electronic component assembly line that may utilize networked electrostatic discharge (NESD) monitoring in accordance with embodiments of the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to electrostatic discharge (ESD), more particular aspects relate to connecting electrostatic discharge measurement to provide enhanced protection of electronic components. While the present disclosure is not necessarily limited to such applications, various aspects of the disclosure may be appreciated through a discussion of various examples using this context.

Electronic componentry (electronics) has become ubiquitous in the modern world as many more devices are coming with integrated circuits (e.g., smart-phones, connected appliances, etc.). The manufacturing of electronic components has become not just one but many industries as electronics companies are tasked with creating more and more electronics. For example, suppliers create electronic components that are combined into more complex electronic components. In some cases tens or hundreds of electronic components may be required for consumer-facing devices (e.g., automobiles, home-entertainment systems, etc.). As the demand has risen electronics companies are tasked with increasing the efficiency and reducing the cost of electronic component manufacturing.

Electrostatic discharge (ESD) may decrease the efficiency of manufacturing electronics. ESD may cause damage to integrated circuits and other electronic components. ESD may occur when electricity suddenly flows between two electrically charged objects (e.g., triboelectric charging, electrostatic induction, etc.). ESD may decrease efficiency by reducing the number of viable components produced. A given number of electrical components may be exposed to one or more ESDs as they are moved through manufacturing. Workers may be handling the electrical components, placing the components on various tables, and touching the components with tools or machines. As components are exposed to ESD they may be damaged. The damaged electronics may be unsuitable for their originally designed functions. In some situations, it may be difficult to determine which components were broken and at which stage of assembly.

To prevent ESD damage many electronics manufacturers may utilize various techniques and devices to help prevent ESD. Electronics manufacturers may utilize tools that are grounded such as soldering irons that are plugged into a grounded electrical outlet. In some situations, the tools may be modified by being tethered to a grounding point. Electronics manufacturers may also utilize workspaces that also prevent ESD damage, such as grounding workspaces. Electronics manufacturers may also try to ensure that workers are grounded either indirectly or directly, by utilizing grounding mats or wrist straps, respectively. Each of these techniques may include feedback mechanisms to ensure usage of these devices. The feedback mechanisms may provide audible or visual feedback through lights and sounds to the workers.

The techniques may be designed such that each individual worker complies with usage of devices and environments designed to mitigate ESD problem conditions (e.g., a potential ESD damage). The techniques may rely on each individual worker following the guidelines. The techniques may be isolated to each worker (e.g., a first worker may rely on one or more mitigation techniques that a separate from other workers). In some situations, utilizing quality assurance processes may catch worker non-compliance or failed equipment that may reduce damage of ESD problem conditions. After assembly of electronics a subset of the assembled electronics may be tested to ensure no damage occurred from ESD. If ESD damage is found, electronics manufacturers may assign additional employees to verify the ESD prevention is sufficient. Verification may include retraining all workers to properly and consistently use ESD prevention devices, inspecting each ESD prevention device for damage, or retesting every workspace to ensure devices have adequate grounding.

In some embodiments, more advanced protection of electronic components may be achieved through networked electrostatic discharge (NESD) monitoring. NESD monitoring may include providing a plurality of sensors, each sensor capable of measuring actual electrostatic charges. NESD monitoring may also include a one or more central servers to analyze the ESD data. The sensors may record current and voltage from various places within a manufacturer's facility (e.g., assembly stages of an assembly line). The sensors may be communicatively coupled (e.g., networked) to each other to centrally aggregate ESD data. In some embodiments, the sensors may be wirelessly connected to each other.

The central servers of the NESD monitoring may record the measurements of the sensors. The central servers may map out currents and voltages over time from the sensors to record histories of each assembly stage of the assembly line. In some embodiments, the central servers may be utilized to provide early warnings or predict possible danger conditions before electronics are damaged in manufacturing. In some embodiments, the central servers may be utilized to diagnose component failure and isolate problem situations within the assembly line. In some embodiments, the central servers may be utilized to update existing potential danger conditions based on previous diagnoses.

NESD monitoring may also provide instantaneous measurement and diagnosis conforming to and surpassing other models. In detail, many methods of determining levels of damage may be used in the ESD field. These methods may include mapping the waveform of discharge of electrostatic current and voltage through various tests (e.g., ESD I-V curves). For example, the human body model (HBM) may test an electronic component for damage after receiving various levels of discharge from a charged human. The tests from the HBM may allow for creation of a corresponding current voltage curve (I-V curve) including a threshold. In a second example, the machine model (MM) may test an electronic component for damage after receiving discharges from a charged tool and creation of corresponding current voltage curve and/or threshold. Because the NESD monitoring provides real-time ESD measurements such as current and voltage, warnings and stop procedures may be implemented to prevent a damage condition based on an electrical components I-V curve.

FIG. 1 depicts an electronic component assembly line 100 that may utilize networked electrostatic discharge (NESD) monitoring in accordance with embodiments of the disclosure. FIG. 1 may include an environmental view 100A of the assembly line 100, and a magnified view 100B of a component of the NESD monitoring. The assembly line 100 may include a plurality of workers including a first worker 110, and a second worker 112. The assembly line 100 may include grounding 120 (e.g., one or more wires with a pathway for a charge to flow to the ground). The assembly line 100 may also include a first assembly stage 130, a second assembly stage 140, and additional assembly stages (not depicted) electrically coupled to the grounding 120 to prevent ESD damage. The first assembly stage 130 may include equipment such as a grounding mat 132, a workspace 134, and a tool 136 for the assembly of electronics. The second assembly stage 140 may include equipment such as a workspace 142, a tool 144, and a wrist strap 146. The assembly stages 130 and 140 may include other equipment (not depicted) such as tools or workspaces.

The NESD monitoring may include the following: a plurality of sensors 150A, 150B, 150C, 150D, 150E, and 150F (collectively, 150) to measure ESD; a network base station 160 to relay ESD measurements; and one or more servers 170 for receiving the ESD measurements. The NESD monitoring may be utilized to implement a control program to prevent ESD damage (e.g., ESD S20.20). The control program may alert the workers 110 and 112 regarding potential danger conditions relating to ESD. In some embodiments, the NESD monitoring may be utilized for failure analysis.

The plurality of sensors 150 of the NESD monitoring may measure the I-V curve from the equipment in the first assembly stage 130 and the second assembly stage 140. The sensors 150 may be communicatively coupled to the base station 160 through a network (e.g., a wired network, a wireless network, or a combination thereof). The sensors 150 may be attached to a piece of equipment to enable reading ESD measurements of the piece of equipment and to enable transmission of the ESD measurements to the network base station 160. In some embodiments, the sensors 150 may also be attached to the equipment to allow service and replacement of the sensors.

The sensors 150 may be hidden from view such as sensor 150C being physically mounted to the inside of tool 136. In some embodiments, the sensors 150 may be integrally coupled into the equipment. For example, sensor 150A and sensor 150E may be molded into the underside of mat 132 and workspace 142, respectively. In some embodiments, the equipment may be designed to physically interface with the sensors 150. For example, the wrist strap 146 may provide for an enclosed compartment (not depicted) and the sensor 150F may reside within the enclosed compartment. In some embodiments, the sensors 150 may be attached to the surface of the equipment. In a first example, sensor 150B is physically coupled to the side of workspace 134 to provide for more accurate measurement of ESD. In a second example, sensor 150D is physically coupled to the outside of tool 144 to provide for more reliable transmission of ESD measurements to network base station 160.

Each sensor 150 may include a plurality of components. Magnified view 100B of sensor 150D may depict components representative of one or more of the sensors 150. Sensors 150D may include the following: an input-output (I/O) 152, a processor 153, a memory 154, a network transmitter 156, and a power source 158. The I/O 152 may be serialized to ground to detect the instantaneous measurements of static electricity. The measurements of static electricity may include the exact current or voltage value of the ESD I-V curve (e.g., five milliamps, eighty milliamps, fifty volts, 1,500 volts, etc.). The processor 153 may be one or more integrated circuits designed to read from the I/O 152 and the memory 154. The memory 154 may be one or more integrated circuits designed to store information regarding the sensor 150D such as a serial number or other identifier. The processor 153 may utilize the network transmitter 156 to send the measurements and other information regarding the sensor 150D to the network base station 160. The network transmitter 156 may utilize one or more existing network technologies (e.g., near field communication; short range wireless communication, such as Bluetooth; wired network communications, such as Ethernet; etc.). The power source 158 may be a finite power source, such as a battery. The processor 153 may read from and transmit through the I/O 152 and network transmitter 156, respectively, continuously. Continuously may mean rapidly in succession such as every 250 milliseconds, every tenth of a second, every millisecond, etc.

The servers 170 may be able to retain and process the ESD information collected from the sensors 150. Each server 170 may be in the form of a computer, such as the example computer depicted in FIG. 3. The servers 170 may receive ESD measurements from the sensors 150 through the network base station 160. The network base station 160 may communicatively couple to the servers 170 through a network (e.g., a wired network, a wireless network, or a combination thereof). In some embodiments, the servers 170 may be located remotely and the network may be the Internet. The servers 170 may communicate with a data source 172 (e.g., a hard-drive, a database, network attached storage, etc.). In some embodiments, the servers 170 may also communicate with other data sources (not depicted) (e.g., databases that track the movement of various electronic components as they travel through the assembly line). The servers 170 may output to one or more output devices including output 174 and output 176. The outputs 174 and 176 may provide audiovisual information to the workers 110 and 112 regarding ESD of the assembly line 100.

The data source 172 may contain records such as the location and function of the equipment of the assembly stages 130 and 140. The records may also be related to the type of electronic components being handled at a given assembly stage and the electronic specifications of the electronic components. The electronic specifications may relate to ability of an electronic component to receive ESD without damage (e.g., voltage thresholds that are safe and will not damage a component, current thresholds that are cautionary and may damage a component, thresholds that do damage a component, etc.). The records may contain information related to ESD history of a given assembly stage (e.g., past occurrences of ESD values at a given sensor over time). In embodiments where the servers 170 communicate with other databases, location information of electronic components may be copied to data source 172 and associated with ESD information to form a more complete ESD history.

The servers 170 may continuously receive ESD I-V data from the sensors 150. In some embodiments, the servers 170 may also receive identifying information from the sensors 150 (e.g., an identifier that is unique to a given sensor). The servers 170 may update the ESD history of a given assembly stage based on the received ESD measurements and identifying information from the ESD sensors. The servers 170 may also store timing related information related to the ESD measurements (e.g., a timestamp indicative of the reading from a given sensor). Based on the timing related information, the servers 170 may be able to determine secondary ESD information (e.g., an increase or decrease in ESD current over time, normal fluctuations in ESD I-V values, abnormal measurements, etc.). The servers 170 may also store information not directly related to ESD measurements.

Based on the updated ESD history the servers 170 may determine there exists a potential ESD danger condition (e.g., excessive current, unusually increasing voltage, etc.). The potential ESD danger condition may be based upon comparing received values with an electronic component's specifications. In a first example, a HBM indicator from sensor 150F may indicate that current in worker 112 exceeds a threshold HBM for an electrical component the worker may be assigned to work on at assembly stage 140. In a second example, a MM indicator from sensor 150C may indicate that voltage in tool 136 is close to a threshold HBM for an electrical component that worker 110 is assigned to work on at assembly stage 130.

Based on the potential ESD danger condition, servers 170 may notify one or more of the workers 110 and 112. The notification may be in the form of a stop command (e.g., an audible tone, a visual indicator). The stop command may be sent to the outputs 174 and 176. The type of stop command sent by the servers 170 may be based on the type of potential ESD danger. In a first example, sensor 150D may send a measurement with an excessive set of ESD values, indicative of a high level of electrostatic current from tool 144. The high level of electrostatic current may indicate a lack of grounding 120 (e.g., an unplugged device because the device was recently serviced). The servers 170 may determine, from the measurement that the tool 144 has enough current to electrostatically damage an electronic component being assembled in assembly stage 140. The server 170 may send a stop command to output 176. The stop command may be in the form of a flashing display of text in a large font. The stop command may also indicate to the worker 112 to diagnose or replace the tool 144 before resuming assembly. The stop command be accompanied by an alarm sound repeated every second.

In a second example, sensor 150B may be sending an inconsistent ESD values, or values that may fluctuate outside of a given range. The fluctuation may be underneath a threshold indicative of possible ESD damage to the electronic component. Based on the measurements received from sensor 150B, the servers 170 may determine—by comparing the received measurements to historical measurements stored in data source 172—that workspace 134 has a loose ground connection. Servers 170 may send a notification to output 174 for receipt and understanding by worker 110. The notification may contain the text "Workspace ground connection loose: please place electronic component into antistatic bag and verify workspace grounding." The notification may be displayed in a font and color indicative of a cautionary condition (e.g., the color yellow and a normal font). The notification may also be audible in the form of a chime repeated every five seconds.

In some embodiments, the NESD monitoring may be utilized to pinpoint the cause of damage to a previously damaged electronic component within the assembly line 100. In detail, the workers 110 and 112 assemble electronic components at assembly stages 130 and 140, respectively. After assembly electronics testers may perform quality assurance testing on the electronic components (e.g., verifying the integrity of electrical traces, testing electronics operations, etc.). If an electronics tester determines that a part has damage or is not performing properly they can enter access the servers 170 through a terminal (not depicted) that is communicatively coupled to the servers.

The electronics tester can request from the servers 170 a likely cause of damage to the electronic component. The request may be in the form of providing the serial number of the electronic component. In some embodiments, the request may include the type of failure exhibited by the electronic component. Because the servers 170 have access to the ESD history including any potential ESD danger conditions recoded in the data source 172, the servers may be able to analyze each ESD to which the electronic component was exposed. The servers 170 may also have access to specifications of the electronic component, through data sources or through input from the electronics tester. The servers 170 may pinpoint a given assembly stage that caused of the ESD damage (e.g., assembly stage 130). In some embodiments, the servers 170 may generate at least one corrective action that may be taken regarding the assembly line 100 based on the potential ESD danger conditions and the identified damage. The corrective action may be a textual or visual report indicating the most likely locations that could provide a dangerous ESD, including numerical values, as well as predictive numerical values of ESDs after the corrective action is taken. The corrective action may be an upgrade to the grounding of a tool or a workspace. The corrective action may be an upgrade to worker-worn grounding equipment. The corrective action may be adding additional grounding to a piece of equipment.

Figure 2:
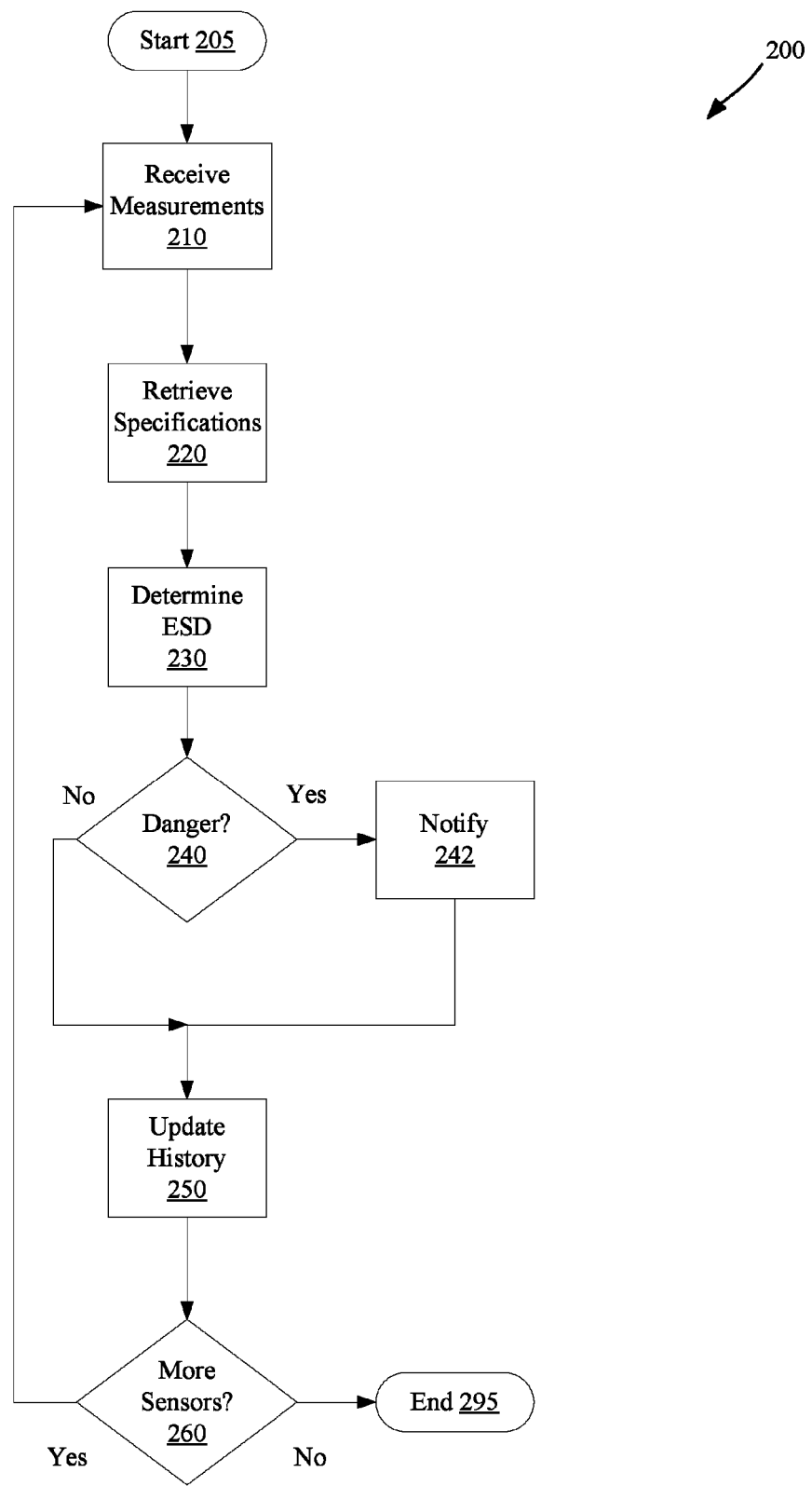
FIG. 2 depicts an example method for determining a potential electrostatic discharge that may damage an electronic component in an assembly line in accordance with embodiments of the present disclosure.

FIG. 2 depicts an example method 200 for determining a potential electrostatic discharge that may damage an electronic component in an assembly line in accordance with embodiments of the present disclosure. Method 200 may be executed by a server coupled to a plurality of sensors that measure ESD of equipment and workers. Each of the sensors may provide ESD measurements through a network, such as a wireless local area network. Method 200 may include more or less steps than those depicted. In embodiments, method 200 may be performed continuously (e.g., every 100 milliseconds, every ten milliseconds).

From start 205, one or more measurements may be received at 210. The measurements may be sent from one sensor of the plurality of sensors. The plurality of sensors being physically coupled to various equipment and workers in the assembly line. The received measurements, at 210, may include a serial number or other identifier of the sensor as well as an ESD I-V value (e.g., sensor one measures ten volts, sensor two measure eight milliamps, etc.). After receiving the measurements, at 210, the server may retrieve one or more specifications related to an electronic component near the sensor at 220. The specifications may be retrieved, at 220, by the server from a data source, such as a database. The specifications may include ESD information such as ESD I-V curves indicative of maximum current and voltage that the electronic component may be able to withstand. The specifications may also include ESD information such as ESD I-V thresholds that are near enough of the maximum current and voltage that the electronic component may be in danger (e.g., above eighty percent of maximum current, within 250 volts of maximum, etc.). The specifications may also include ESD history such as previous measurements of sensor over a period of time. In some embodiments, the specification may include ESD values of equipment, such as an ESD I-V value that is safe for a piece of equipment to have or an ESD I-V value indicative that a piece of equipment may be malfunctioning.

The server may utilize the measurements and the specifications to determine the condition of ESD for the electronic component at 230. The determination, at 230, may be comparing the received measurement from the sensor to the retrieved specifications of the electronic component (e.g., a current is beyond a maximum value stored in the specifications, a voltage is within a danger zone, etc.). The determination, at 230, may be the receiving of a specific value (e.g., a null value that may indicate that a given sensor has ceased to operate properly). The determination, at 230, may be comparing the measurement to a previous measurement of the ESD history (e.g., determining that the ESD current has doubled from the previous measurement). The determination, at 230, may be comparing the measurement to multiple previous measurements of the ESD history (e.g., determining that the ESD voltage is abnormally increasing and decreasing in an unpredictable manner).

If the determined ESD condition is indicative of potential danger, at 240, the server may notify workers in the assembly line at 242. The notification, at 242, may be through speakers or displays in communication with the server. The notification may be based on the determined potential danger, such as a more intrusive or obvious notification for a potential ESD danger that is more likely to damage a given electronic component (e.g., above a threshold, near a maximum). If there is no potential danger at 240 (alternatively after notification at 242), the server may update the history portion of the specification at 250. The updated history, at 250, may be utilized in the future by the server to enable determinations based on more extensive information. If more sensors are trying to provide measurements, at 260, the server may again receive those measurements at 210. If no more sensor measurements are provided, at 260, method 200 may end at 295.

In an example of method 200, a server may provide measurements from a first sensor at 210. The measurements may include an identifier of the first sensor and an ESD I-V value of seven milliamps. Based on the identifier, the server may retrieve specifications of an electronic component being assembled, at 220. The specifications may indicate the electronic component will safely withstand an ESD of twelve milliamps. The specifications may also indicate that the electronic component is in no potential danger (i.e., a threshold) if exposed to an ESD of less than ten milliamps. The determination at 230 may be that there is no potential danger condition at 240. The server may record the seven milliamp value as well as the time sensor measurements were received and update the history of the first sensor at 250. No additional sensor values may be present after the first sensor measurement, at 260, and method 200 may end at 295.

In another example of method 200, a server may provide measurements from a second sensor at 210. The measurements may include an identifier of the second sensor and an ESD I-V value of 100 volts. Based on the identifier, the server may retrieve specifications of an electronic component being assembled, at 220. The specifications may indicate the electronic component will safely withstand an ESD of 550 volts. The specifications may also indicate that the electronic component is in no potential danger (i.e., a threshold) if exposed to an ESD of less than 450 volts. The specification may also include a historical reading of 350 volts 100 milliseconds before the received measurement of 100 volts. The determination at 230 may be that there is potential danger condition, at 240, because the voltage is varying too much within a period of time. The server may issue a stop command to the workers nearest the second sensor, at 242. The server may record the 100 volts value as well as the time sensor measurements were received and update the history of the second sensor at 250. No additional sensor values may be present after the second sensor measurement, at 260, and method 200 may end at 295.

Figure 3:
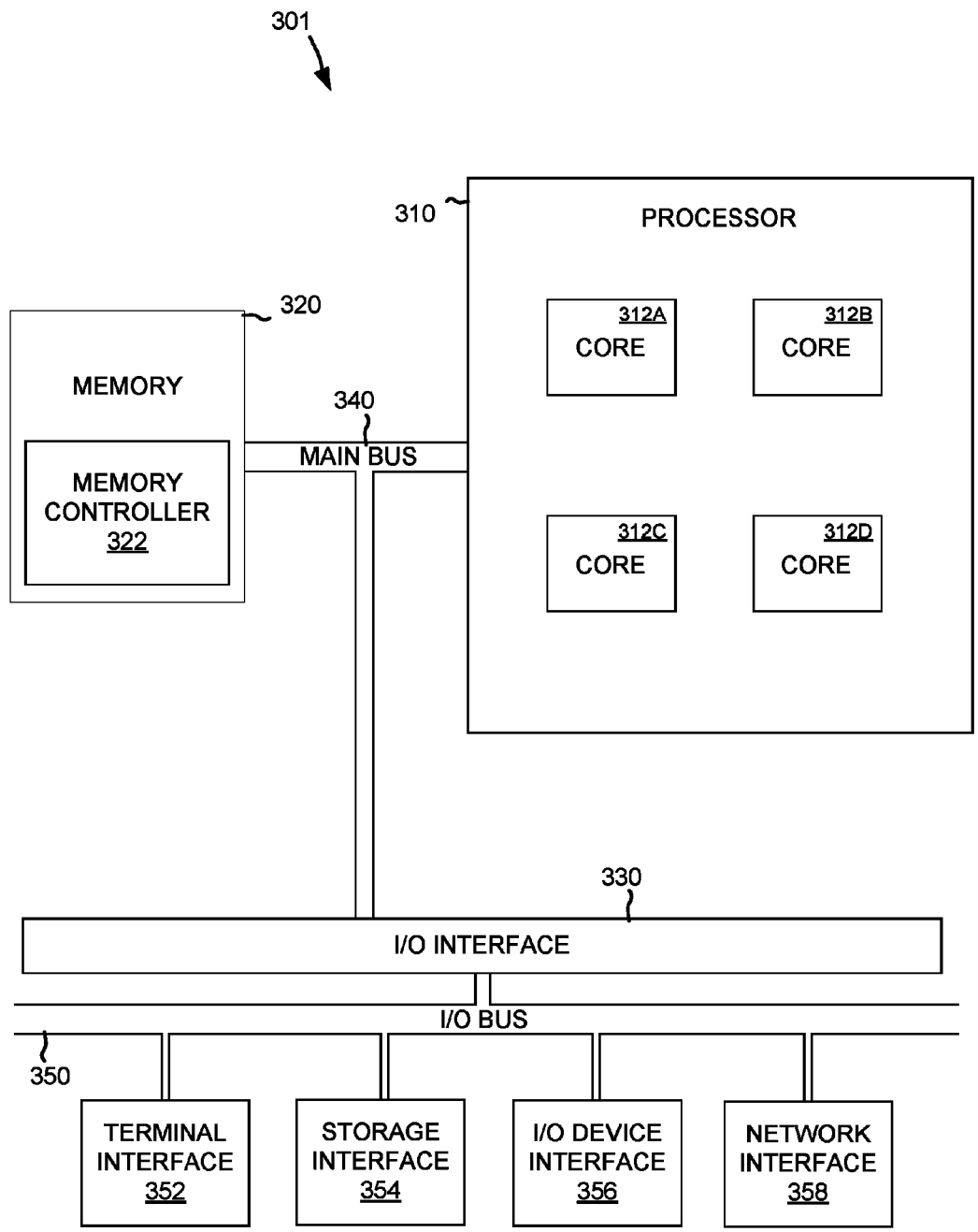
FIG. 3 depicts the representative major components of an example computer system that may be used, in accordance with embodiments of the present disclosure.

FIG. 3 depicts the representative major components of an example computer system 301 that may be used, in accordance with embodiments of the present disclosure. It is appreciated that individual components may vary in complexity, number, type, and\or configuration. The particular examples disclosed are for example purposes only and are not necessarily the only such variations. The computer system 301 may comprise a processor 310, memory 320, an input/output interface (herein I/O or I/O interface) 330, and a main bus 340. The main bus 340 may provide communication pathways for the other components of the computer system 301. In some embodiments, the main bus 340 may connect to other components such as a specialized digital signal processor (not depicted).

The processor 310 of the computer system 301 may be comprised of one or more cores 312A, 312B, 312C, 312D (collectively 312). The processor 310 may additionally include one or more memory buffers or caches (not depicted) that provide temporary storage of instructions and data for the cores 312. The cores 312 may perform instructions on input provided from the caches or from the memory 320 and output the result to caches or the memory. The cores 312 may be comprised of one or more circuits configured to perform one or methods consistent with embodiments of the present disclosure. In some embodiments, the computer system 301 may contain multiple processors 310. In some embodiments, the computer system 301 may be a single processor 310 with a singular core 312.

The memory 320 of the computer system 301 may include a memory controller 322. In some embodiments, the memory 320 may comprise a random-access semiconductor memory, storage device, or storage medium (either volatile or non-volatile) for storing data and programs. In some embodiments, the memory may be in the form of modules (e.g., dual in-line memory modules). The memory controller 322 may communicate with the processor 310, facilitating storage and retrieval of information in the memory 320. The memory controller 322 may communicate with the I/O interface 330, facilitating storage and retrieval of input or output in the memory 320.

The I/O interface 330 may comprise an I/O bus 350, a terminal interface 352, a storage interface 354, an I/O device interface 356, and a network interface 358. The I/O interface 330 may connect the main bus 340 to the I/O bus 350. The I/O interface 330 may direct instructions and data from the processor 310 and memory 320 to the various interfaces of the I/O bus 350. The I/O interface 330 may also direct instructions and data from the various interfaces of the I/O bus 350 to the processor 310 and memory 320. The various interfaces may include the terminal interface 352, the storage interface 354, the I/O device interface 356, and the network interface 358. In some embodiments, the various interfaces may include a subset of the aforementioned interfaces (e.g., an embedded computer system in an industrial application may not include the terminal interface 352 and the storage interface 354).

Logic modules throughout the computer system 301—including but not limited to the memory 320, the processor 310, and the I/O interface 330—may communicate failures and changes to one or more components to a hypervisor or operating system (not depicted). The hypervisor or the operating system may allocate the various resources available in the computer system 301 and track the location of data in memory 320 and of processes assigned to various cores 312. In embodiments that combine or rearrange elements, aspects and capabilities of the logic modules may be combined or redistributed. These variations would be apparent to one skilled in the art.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method comprising:
   receiving a first electrostatic discharge (ESD) measurement from a first sensor, the first sensor utilizing a wireless network to send the measurement, the first sensor at a first stage of an assembly line of electronic components susceptible to damage from an electrostatic discharge;
   receiving a second ESD measurement from a second sensor, the second sensor utilizing the wireless network to send the second measurement, the second sensor at a second stage of the assembly line;
   updating, based on the first ESD measurement, an ESD history for the first assembly stage;
   updating, based on the second ESD measurement, the ESD history for the second assembly stage; and
   determining, based on the ESD history, a potential ESD danger condition in the assembly line.

2. The method of claim 1, wherein the determining comprises comparing the first ESD measurement to a past ESD measurement of the ESD history, and wherein the determined potential ESD danger condition is an increase in the ESD at the first assembly stage.

3. The method of claim 1, wherein the determining comprises comparing a third ESD measurement to a past ESD measurement, and wherein the determined potential ESD danger condition is an increase in the ESD at a third assembly stage, and wherein the method further comprises:
   receiving the third ESD measurement from a third sensor, the third sensor utilizing the wireless network to send the third measurement, the third sensor at the third stage of the assembly line; and
   updating, based on the third ESD measurement, the ESD history for the third assembly stage.

4. The method of claim 1, further comprising:
   identifying ESD damage to an electronic component, the electronic component assembled by the assembly line; and
   generating, based on the potential ESD danger condition and based on the identified ESD damage to the assembled component, a corrective action to the assembly line.

5. The method of claim 1, further comprising:
   sending, based on the determined potential ESD danger condition, a stop command to the assembly line.

6. The method of claim 5, wherein the determined potential ESD danger condition is at the second assembly stage, and wherein the stop command is targeted at the second assembly stage.

7. The method of claim 1, wherein the potential ESD danger condition is a voltage exceeding a predetermined threshold.

8. The method of claim 1, wherein the potential ESD danger condition is a voltage near but not exceeding a predetermined threshold.

9. The method of claim 1, wherein the potential ESD danger condition is a current exceeding a predetermined threshold.

10. The method of claim 1, wherein the potential ESD danger condition is a current near but not exceeding a predetermined threshold.

11. The method of claim 1, wherein the first sensor is worn by a worker on the assembly line.

12. A computer program product comprising a non-transitory computer readable storage medium having program instructions embodied therewith, the program instructions executable by a computer to perform a method comprising:

receiving a first electrostatic discharge (ESD) measurement from a first sensor, the first sensor utilizing a wireless network to send the measurement, the first sensor at a first stage of an assembly line of electronic components susceptible to damage from an electrostatic discharge;

receiving a second ESD measurement from a second sensor, the second sensor utilizing the wireless network to send the second measurement, the second sensor at a second stage of the assembly line;

updating, based on the first ESD measurement, an ESD history for the first assembly stage;

updating, based on the second ESD measurement, the ESD history for the second assembly stage; and determining, based on the ESD history, a potential ESD danger condition in the assembly line.

13. The computer program product of claim 12, wherein the method further comprises:

sending, based on the determined potential ESD danger condition, a stop command to the assembly line.

14. The computer program product of claim 13, wherein the determined potential ESD danger condition is at the second assembly stage, and wherein the stop command is targeted at the second assembly stage.

15. The computer program product of claim 12, wherein the potential ESD danger condition is a voltage exceeding a predetermined threshold.

16. The computer program product of claim 12, wherein the potential ESD danger condition is a voltage near but not exceeding a predetermined threshold.

17. A system comprising:
a wireless network;
a first sensor at a first stage of an assembly line of electronic components susceptible to damage from electrostatic discharge, the first sensor utilizing the wireless network to send first electrostatic discharge (ESD) measurements;
a second sensor at a second stage of the assembly line, the second sensor utilizing the wireless network to send second ESD measurements;
a memory; and
a processor, the processor in communication with the memory and in communication with the wireless network, wherein the processor is configured to perform a method comprising:
receiving a first ESD measurement of the first ESD measurements from the first sensor;
receiving a second ESD measurement of the second ESD measurements from the second sensor;
updating, based on the first ESD measurement, an ESD history for the first assembly stage;
updating, based on the second ESD measurement, the ESD history for the second assembly stage; and
determining, based on the ESD history, a potential ESD danger condition in the assembly line.

18. The system of claim 17, wherein the determining comprises comparing the first ESD measurement to a past ESD measurement of the ESD history, and wherein the determined potential ESD danger condition is an increase in the ESD at the first assembly stage.

19. The system of claim 17, wherein the system further comprises:
a third sensor at a third stage of the assembly line, the third sensor utilizing the wireless network to send third ESD measurements, wherein the method further comprises:
receiving a third ESD measurement of the third ESD measurements from the third sensor; and
updating, based on the third ESD measurement, the ESD history for the third assembly stage.

20. The system of claim 17, wherein the method further comprises:
identifying ESD damage to an electronic component, the electronic component assembled by the assembly line; and
generating, based on the potential ESD danger condition and based on the identified ESD damage to the assembled component, a corrective action to the assembly line.

* * * * *